United States Patent
Kang

(10) Patent No.: US 12,120,818 B2
(45) Date of Patent: Oct. 15, 2024

(54) PRINTED CIRCUIT BOARD

(71) Applicant: LG INNOTEK CO., LTD., Seoul (KR)

(72) Inventor: Myung Gu Kang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 178 days.

(21) Appl. No.: 17/910,528

(22) PCT Filed: Mar. 3, 2021

(86) PCT No.: PCT/KR2021/002594
§ 371 (c)(1),
(2) Date: Sep. 9, 2022

(87) PCT Pub. No.: WO2021/182790
PCT Pub. Date: Sep. 16, 2021

(65) Prior Publication Data
US 2023/0156915 A1 May 18, 2023

(30) Foreign Application Priority Data

Mar. 10, 2020 (KR) .................. 10-2020-0029582

(51) Int. Cl.
*H05K 1/11* (2006.01)
*H05K 3/34* (2006.01)

(52) U.S. Cl.
CPC ............. *H05K 1/111* (2013.01); *H05K 3/341* (2013.01); *H05K 2201/10984* (2013.01); *H05K 2201/2081* (2013.01); *H05K 2203/041* (2013.01)

(58) Field of Classification Search
CPC .............. H05K 1/111; H05K 3/341; H05K 2201/10984; H05K 2201/2081; H05K 2201/099; H05K 2201/09909
See application file for complete search history.

(56) References Cited

U.S. PATENT DOCUMENTS

| | | | |
|---|---|---|---|
| 5,218,234 A * | 6/1993 | Thompson | H01L 21/563 257/E23.129 |
| 6,774,497 B1 | 8/2004 | Qi et al. | |
| 2005/0012208 A1 | 1/2005 | Jang et al. | |
| 2007/0096337 A1* | 5/2007 | Choi | H01L 24/28 257/E21.511 |

(Continued)

FOREIGN PATENT DOCUMENTS

| | | |
|---|---|---|
| JP | 2008-210827 A | 9/2008 |
| KR | 10-2005-0010268 A | 1/2005 |
| KR | 10-2005-0118694 A | 12/2005 |

(Continued)

*Primary Examiner* — Sherman Ng
(74) *Attorney, Agent, or Firm* — Birch, Stewart, Kolasch & Birch, LLP

(57) ABSTRACT

Disclosed is a printed circuit board according to an embodiment. The printed circuit board comprises: a base board; a metal layer, including a pad and a metal line formed in the base board; a solder resist layer that is formed on the base board on which the metal layer is formed and has an opening through which the surface of the metal line is exposed; and an underfill that is formed between the solder resist layer and a semiconductor chip electrically connected to the pad and includes a blocking area formed in the opening.

6 Claims, 5 Drawing Sheets

(56) References Cited

U.S. PATENT DOCUMENTS

2008/0203564 A1    8/2008   Motoyoshi et al.
2013/0062786 A1*   3/2013   Leung ............... H01L 23/49811
                                                                                                     438/106

FOREIGN PATENT DOCUMENTS

KR          10-0862008 B1    10/2008
KR    10-2011-0029466 A     3/2011

* cited by examiner

[FIG. 1]
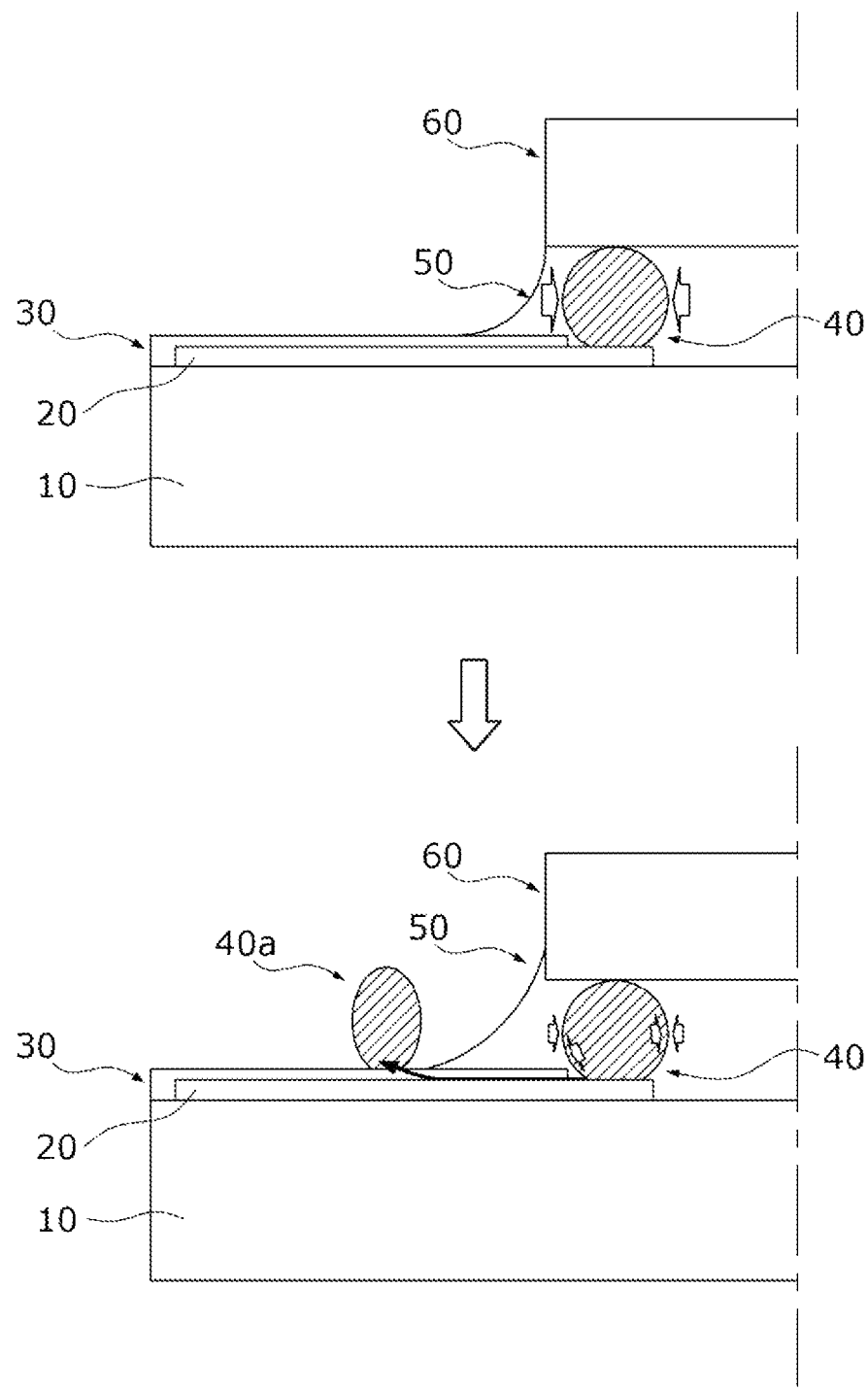

[FIG. 2]
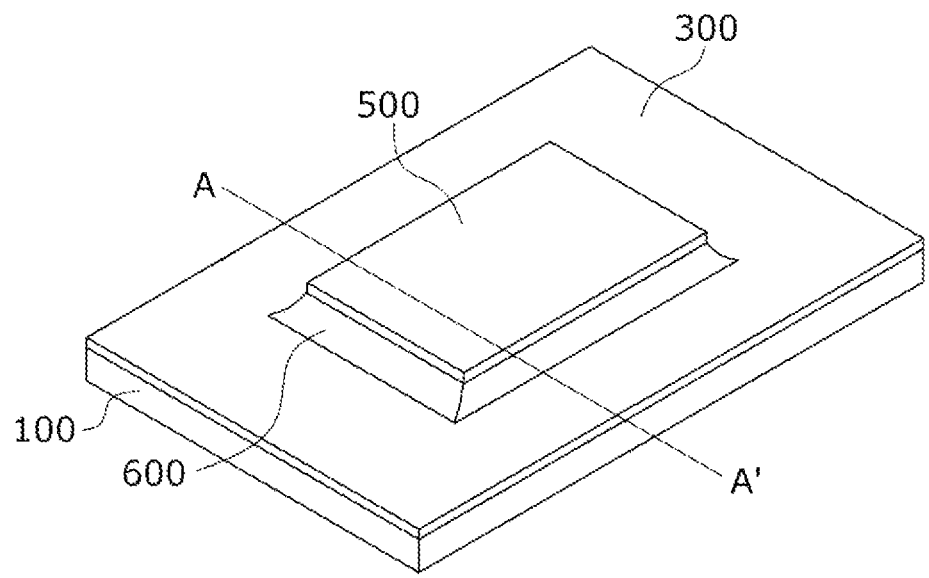
[FIG. 3]
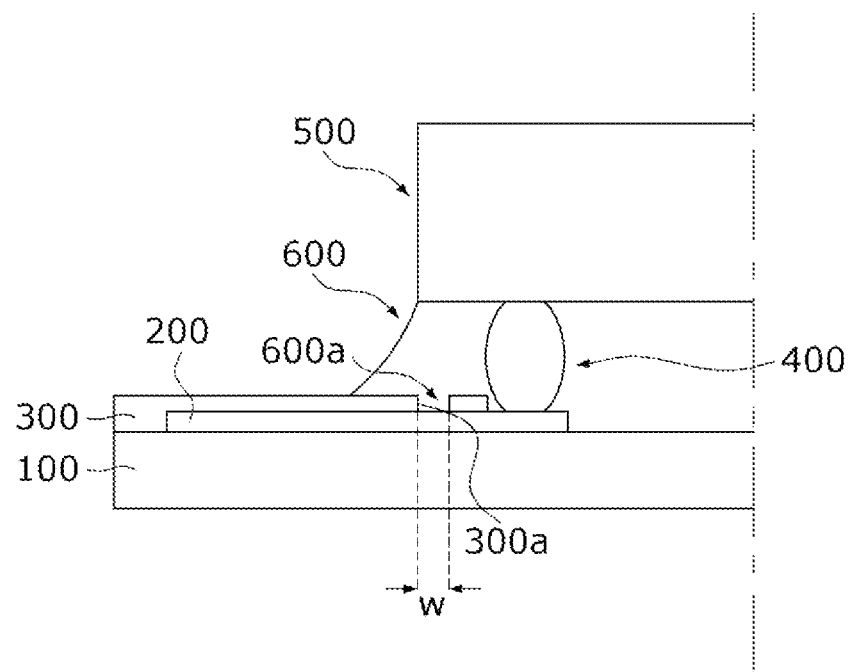

[FIG. 4]
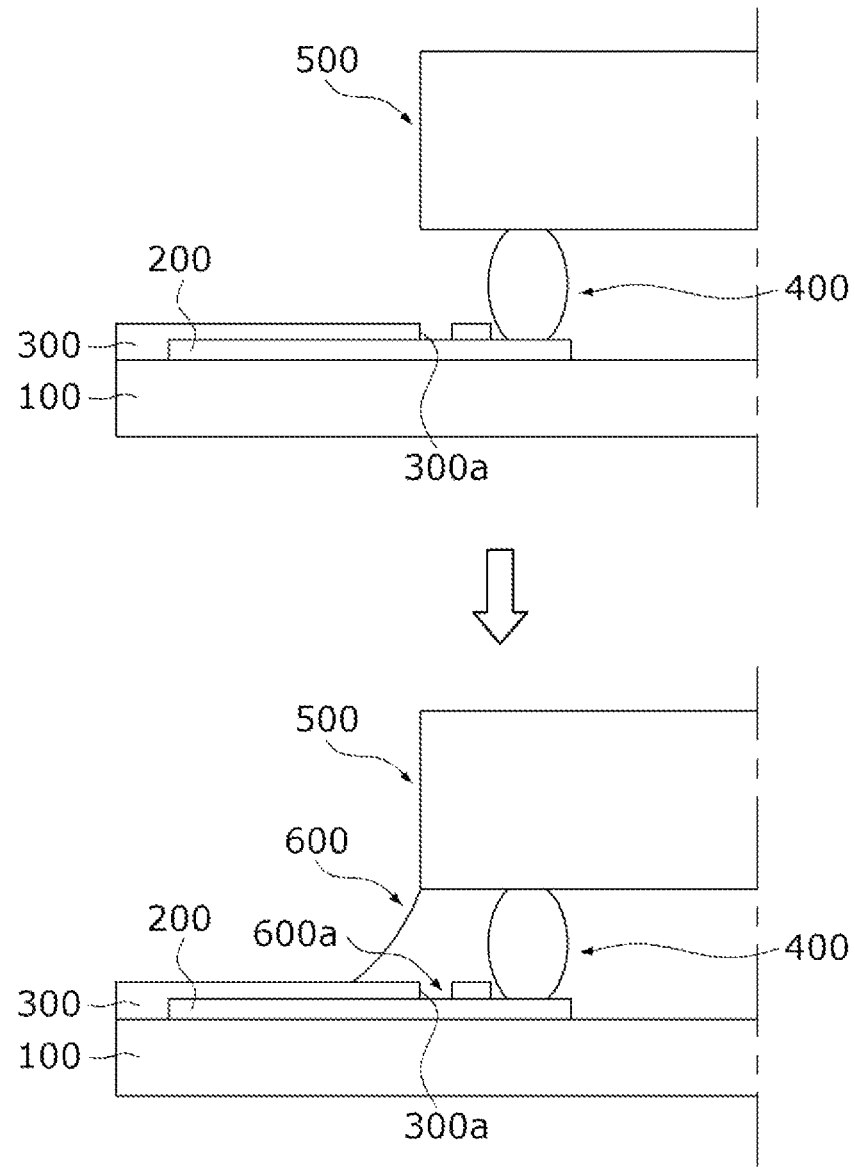

[FIG. 5]
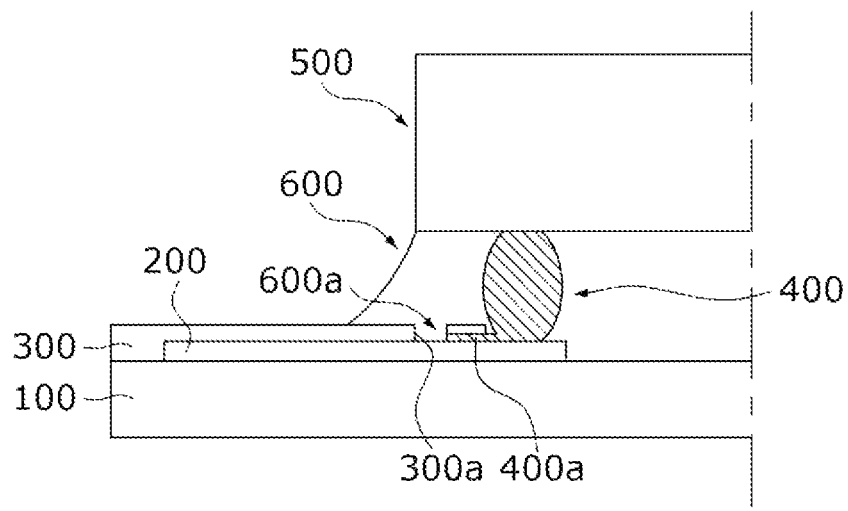
[FIG. 6a]
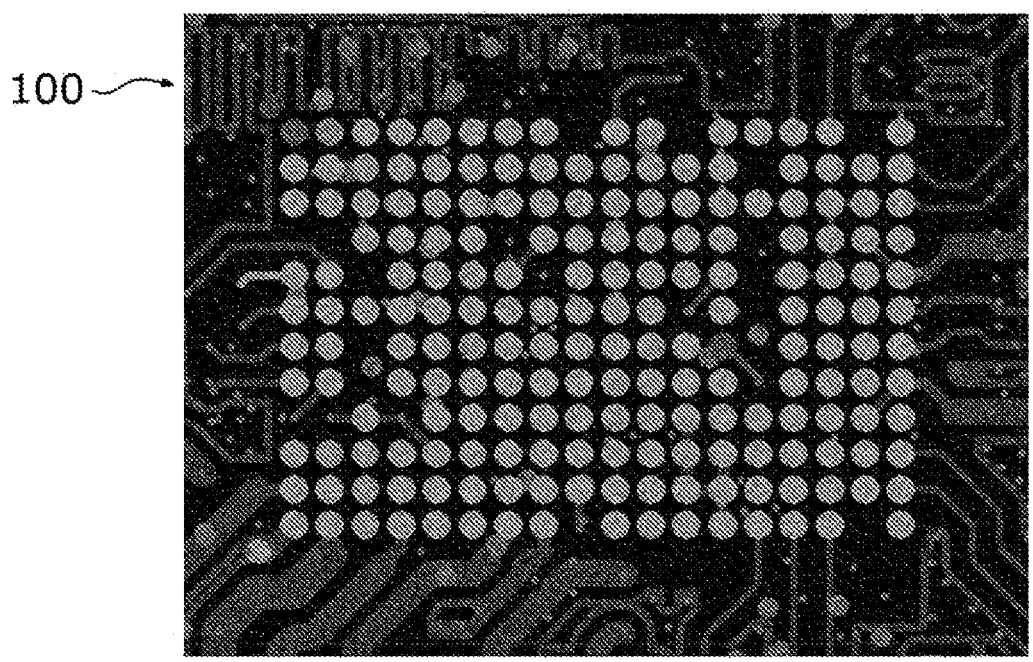

[FIG. 6b]
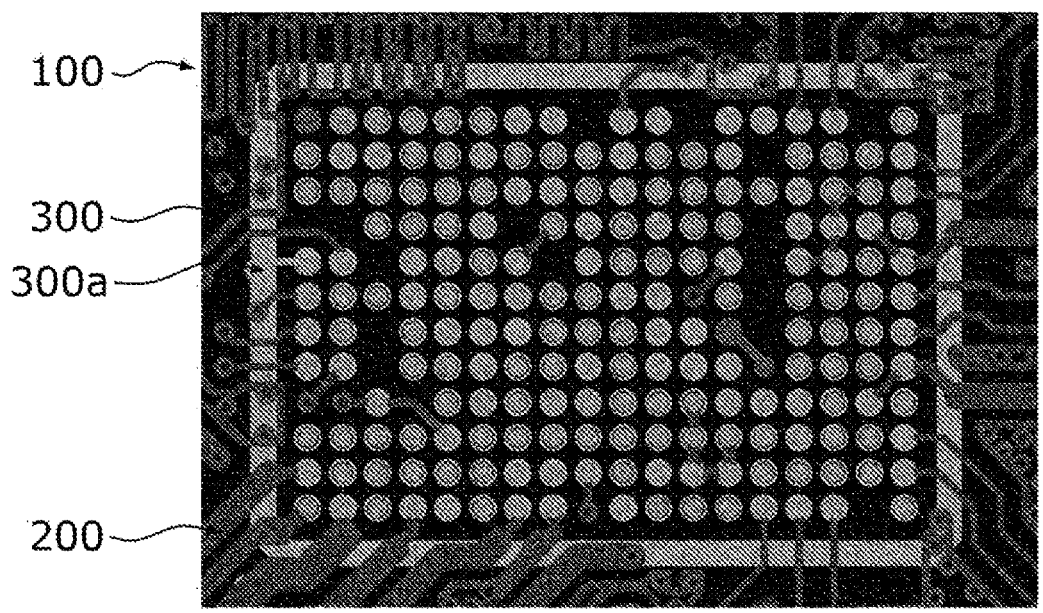
[FIG. 6c]
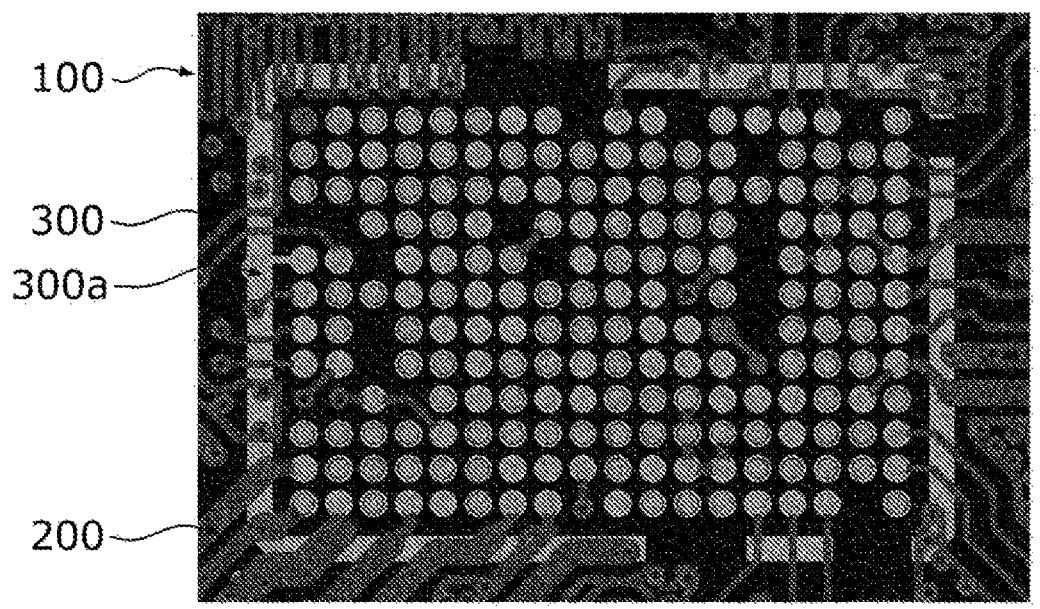

PRINTED CIRCUIT BOARD

CROSS REFERENCE TO RELATED APPLICATIONS

This application the National Phase of PCT International Application No. PCT/KR2021/002594, filed on Mar. 3, 2021, which claims priority under 35 U.S.C. 119(a) to Patent Application No. 10-2020-0029582, filed in the Republic of Korea on Mar. 10, 2020, all of which are hereby expressly incorporated by reference into the present application.

TECHNICAL FIELD

An embodiment relates to a printed circuit board formed with a structure for preventing separation of a solder ball.

BACKGROUND ART

Generally, when a printed circuit board (PCB) is manufactured, a solder resist (SR) is applied as the outermost layer. The solder resist is one of the permanent insulating coating materials, and covers a wiring circuit to prevent the occurrence of unintentional connection by soldering when a component is mounted.

FIG. 1 is a view for describing a problem during reflow of a printed circuit board of the related art.

Referring to FIG. 1, the conventional printed circuit board can include a substrate 10, a metal layer 20, a solder resist layer 30, a solder ball 40, a semiconductor chip 50, and an underfill 60.

During the reflow of this printed circuit board, since an adhesive force between the metal layer 20 and the solder resist layer 30 is weak due to a pressure increase by humidity in the underfill when the solder ball is heated, the solder resist layer 30 is separated and lifted, and the solder is pressed out and passes through this space.

When the printed circuit board is in a moisture absorption state, solder loss further increases and thus can cause product defects. Accordingly, a method capable of preventing solder loss of a product to which the underfill is applied is needed.

PRIOR ART DOCUMENTS (Patent Document 1) Korean Laid-Open Patent Publication No. 10-2000-0018573
(Patent Document 2) Korean Laid-Open Patent Publication No. 10-2001-0017868

DISCLOSURE

Technical Problem

An embodiment is directed to providing a printed circuit board formed with a structure for preventing separation of a solder ball.

Technical Solution

A printed circuit board according to an embodiment includes: a base board; a metal layer including a pad and a metal line formed on the base board; a solder resist layer formed on the base board on which the metal layer is formed and formed with an opening through which a surface of the metal line is exposed; and an underfill formed between the solder resist layer and a semiconductor chip electrically connected to the pad, and including a blocking area formed in the opening.

The blocking area may be formed to surround the entire semiconductor chip along an edge of the semiconductor chip.

The blocking area may be formed to surround a portion of the semiconductor chip along an edge of the semiconductor chip.

The blocking area may be formed in an area where the metal line is formed among the entire edge of the semiconductor chip.

The opening may be formed within a predetermined distance from the pad.

The printed circuit board may further include a solder ball formed on the pad of the metal layer.

The opening may include a plurality of openings which are formed in parallel, and the blocking area may include a plurality of blocking areas respectively formed in the plurality of openings.

A width of the opening may range from 0.2 mm to 0.3 mm.

Advantageous Effects

According to an embodiment, by removing a solder resist surrounding at least a portion of a semiconductor chip among a solder resist layer formed on a base board and forming a blocking area due to an underfill in the removed portion, it is possible to prevent the loss of the solder to the outside when the solder resist is deformed due to an increase in pressure of the underfill during reflow.

According to the embodiment, since it is possible to prevent the loss of the solder by forming the predetermined blocking area in the solder resist layer, it is possible to lower a defect rate of a product to which the underfill is applied.

According to the embodiment, since it is possible to lower the defect rate of the product to which the underfill is applied, reliability can be improved, and accordingly, sales can be expected to increase.

DESCRIPTION OF DRAWINGS

FIG. 1 is a view for describing a problem during reflow of a printed circuit board of the related art.

FIG. 2 is a perspective view illustrating a printed circuit board on which a semiconductor chip according to an embodiment of the present invention is mounted.

FIG. 3 is a cross-sectional view for describing the overall structure of the printed circuit board shown in FIG. 2.

FIG. 4 is a view for describing a process of forming a blocking area according to the embodiment.

FIG. 5 is a view for describing a solder loss prevention principle of the blocking area according to the embodiment.

FIGS. 6A to 6C are views for describing shapes of the blocking area according to the embodiment.

MODES OF THE INVENTION

Hereinafter, preferable embodiments of the present invention will be described in detail with reference to the accompanying drawings.

However, the technical spirit of the present invention is not limited to some embodiments which will be described and may be embodied in various forms, and one or more elements in the embodiments may be selectively combined and replaced to be used within the scope of the technical spirit of the present invention.

Further, terms used in the embodiments of the present invention (including technical and scientific terms), may be interpreted with meanings that are generally understood by those skilled in the art unless specifically defined and described, and terms which are generally used, such as terms defined in a dictionary, may be interpreted in consideration of their contextual meanings in the related art.

In addition, terms used in the description are provided not to limit the present invention but to describe the embodiments.

In the specification, the singular form may also include the plural form unless the context clearly indicates otherwise and may include one or more of all possible combinations of A, B, and C when disclosed as at least one (or one or more) of "A, B, and C."

Further, terms such as first, second, A, B, (a), (b), and the like may be used to describe elements of the embodiments of the present invention.

The terms are only provided to distinguish an element from other elements, and the essence, sequence, order, or the like of the elements are not limited by the terms.

Further, when a particular element is disclosed as being "connected," "coupled," or "linked" to another element, this may not only include a case of the element being directly connected, coupled, or linked to the other element but also a case of the element being connected, coupled, or linked to the other element by another element between the element and the other element.

In addition, when one element is disclosed as being formed "on or under" another element, the term "on or under" includes both a case in which the two elements are in direct contact with each other and a case in which at least another element is disposed between the two elements (indirectly). Further, when the term "on or under" is expressed, a meaning of not only an upward direction but also a downward direction may be included based on one element.

In an embodiment, a printed circuit board with a new structure in which a solder resist surrounding at least a portion of a semiconductor chip among a solder resist layer formed on a base board is removed and a blocking area due to an underfill is formed in the removed portion is proposed.

FIG. 2 is a perspective view illustrating a printed circuit board on which a semiconductor chip according to the embodiment of the present invention is mounted, and FIG. 3 is a cross-sectional view for describing the overall structure of the printed circuit board shown in FIG. 2.

Referring FIGS. 2 and 3, the printed circuit board according to the embodiment may include a base board 100, a metal layer 200, a solder resist layer 300, a solder ball 400, a semiconductor chip 500, an underfill 600, and a blocking area 300a.

The base board 100 includes a first surface and a second surface, and the semiconductor chip 500 may be disposed on the first surface. The base board 100 may be configured as a single layer, but is not necessarily limited thereto, and may be configured as a multi-layer, a build-up layer composed of vias, or the like.

The metal layer 200 may provide an electrical connection between components coupled to the base board 100. The metal layer 200 may be formed on the base board 100 and connected to the semiconductor chip 500. The metal layer 200 may include a pad and a metal line formed on the base board 100. The metal layer 200 may be formed of a conductive material for an electrical connection.

The solder resist layer 300 may be formed on the board 100 on which the metal layer 200 is formed. The solder resist layer 300 may prevent a short circuit between circuit patterns when the solder ball 400 is bonded to an upper portion of the base board 100 or an electronic element is mounted on the base board 100. The solder resist layer 300 may be formed of an insulating material for securing electrical stability.

For example, the solder resist layer 300 may be formed by coating or applying a liquid solder resist ink on the base board 100 on which the metal layer 200 is formed. In this case, a coating method includes physical vapor deposition (PVD), chemical vapor deposition (chemical vapor deposition), atomic layer deposition (ALD), or the like.

The solder resist layer 300 may be formed of a solder resist or a photo solder resist. The solder resist refers to a resist which is pre-coated on a portion where lead should not be applied when components are soldered to the board, and the photo solder resist refers to a photosensitive resist used for assisting a portion which does not require soldering or solder coating.

The solder resist layer 300 may be formed with an opening 300a in an area adjacent to the solder ball 400. The blocking area 600a due to the underfill 600 may be formed in the opening 300a of the solder resist layer 300. In this case, the opening 300a may be designed to have a width W of 0.2 mm to 0.3 mm, and most preferably, 0.2 mm.

The solder ball 400 may electrically connect the metal layer 200 and the semiconductor chip 500.

The semiconductor chip 500 may be disposed on the base board 100, and may be electrically connected to the metal layer 200 through the solder ball 400. Here, the semiconductor chip 500 may be a ball grid array (BGA) chip.

The underfill 600 may be formed between the base board 100 and the semiconductor chip 500 or the solder ball 400. The underfill 600 may be formed in an area larger than a size of the semiconductor chip 500.

Further, a fillet may be formed on outskirts of the underfill 600 to be exposed to the outside.

The blocking area 600a may be formed in the opening 300a of the solder resist layer 300 by the underfill 600. That is, the blocking area 600a may be a protrusion formed by the underfill 600 in an area where a surface of the metal layer 200 is exposed from the solder resist layer 300 by removing the solder resist of a partial area of the solder resist layer 300.

The blocking area 600a may be formed in an area where the semiconductor chip 500 is disposed, and may be formed to surround the semiconductor chip 500 along an edge area of the semiconductor chip 500. The blocking area 600a may be formed to surround the entire semiconductor chip 500, or may be formed to surround at least a portion of the semiconductor chip 500 rather than the entire semiconductor chip 500.

FIG. 4 is a view for describing a process of forming the blocking area according to the embodiment, and FIG. 5 is a view for describing a solder loss prevention principle of the blocking area according to the embodiment.

Referring to FIG. 4, the opening 300a through which the metal layer is exposed may be formed in a portion adjacent to the metal layer 200 on the base board 100, that is, a pad, by removing a portion of the solder resist layer 300.

The semiconductor chip 500 may be electrically connected to the base board 100 on which the opening 300a is formed using the solder ball 400.

By applying an epoxy resin or the like between the base board 100 on which the opening 300a is formed and the semiconductor chip 500 or the solder ball 400, the underfill 600 may be formed, and the blocking area 600a may be formed in opening 300a by the underfill 600.

Since the underfill 600 is designed to exceed the semiconductor chip 500, the blocking area 600a capable of sufficiently reinforcing the metal layer 200 is generated in the opening 300a by the underfill 600 after an underfill process is performed, and thus improvement is possible without a change of the solder resist layer.

Referring to FIG. 5, during the reflow of the printed circuit board, since an adhesive force between the metal layer 200 and the solder resist layer 300 is weak due to a pressure increase by humidity in the underfill when the solder ball melts, the solder resist layer 300 is separated and lifted, and the solder moves through this lifted space.

Since the blocking area 300a is formed on a path along which the solder moves, the movement of the solder may be blocked by the underfill 600 filled in the blocking area 300a.

Accordingly, by removing a portion of the solder resist layer 300 to form the blocking area 300a, it is possible to prevent the solder from escaping to the outside by the blocking area 300a.

FIGS. 6A to 6C are views for describing shapes of the blocking area according to the embodiment.

Referring to FIG. 6A, a metal layer 200 including a circuit pattern and a pad may be formed on the base board 100, and the solder resist layer 300 may be formed on the base board 100 on which the metal layer 200 is formed.

Referring to FIG. 6B, the blocking area 300a may be formed by removing all of the solder resist of the solder resist layer along the edge of the semiconductor chip disposed on the base board 100.

Referring to FIG. 6C, the blocking area 300a may be formed by partially removing the solder resist of the solder resist layer along the edge of the semiconductor chip disposed on the base board 100.

Here, only an area through which the metal layer 200 may be exposed may be removed because solder escapes through a space between the metal layer 200 and the solder resist layer 300.

Here, although an example in which one blocking area is formed along the edge of the semiconductor chip is described, the present invention is not limited thereto, and a plurality of blocking areas may be formed.

For example, by forming a plurality of openings in parallel in the solder resist layer 300, the plurality of blocking areas may be respectively formed in the plurality of openings by the underfill 600.

Although preferable embodiments of the present invention are described above, those skilled in the art may variously modify and change the present invention within a range not departing from the spirit and area of the present invention disclosed in the claims which will be described below.

REFERENCE NUMERALS

100: base board
200: metal layer
300: solder resist layer
400: solder ball
500: semiconductor chip
600: underfill
600a: blocking area

The invention claimed is:

1. A printed circuit board comprising: a base board; a metal layer including a pad and a metal line formed on the base board; a solder resist layer formed on the base board on which the metal layer is formed and formed with an opening through which a surface of the metal line is exposed; and an underfill formed between the solder resist layer and a semiconductor chip electrically connected to the pad, and including a blocking area formed in the opening, wherein the blocking area is formed to surround a portion of the semiconductor chip along an edge of the semiconductor chip, and wherein the blocking area is formed in an area where the metal line is formed among the entire edge of the semiconductor chip.

2. The printed circuit board of claim 1, wherein the blocking area is formed to surround an entire semiconductor chip along an edge of the semiconductor chip.

3. The printed circuit board of claim 1, wherein the opening is formed within a predetermined distance from the pad.

4. The printed circuit board of claim 1, further comprising a solder ball formed on the pad of the metal layer.

5. The printed circuit board of claim 1, wherein: the opening includes a plurality of openings which are formed in parallel; and the blocking area includes a plurality of blocking areas respectively formed in the plurality of openings.

6. The printed circuit board of claim 1, wherein a width of the opening ranges from 0.2 mm to 0.3 mm.

* * * * *